(12) United States Patent
Jalilizeinali et al.

(10) Patent No.: US 8,665,570 B2
(45) Date of Patent: Mar. 4, 2014

(54) DIODE HAVING A POCKET IMPLANT BLOCKED AND CIRCUITS AND METHODS EMPLOYING SAME

(75) Inventors: Reza Jalilizeinali, San Diego, CA (US); Eugene R. Worley, San Diego, CA (US); Evan Siansuri, San Diego, CA (US); Sreeker Dundigal, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 264 days.

(21) Appl. No.: 13/075,701

(22) Filed: Mar. 30, 2011

(65) Prior Publication Data

US 2012/0074496 A1    Mar. 29, 2012

Related U.S. Application Data

(63) Continuation-in-part of application No. 12/403,418, filed on Mar. 13, 2009, now Pat. No. 8,531,805.

(51) Int. Cl.
*H02H 9/00* (2006.01)

(52) U.S. Cl.
USPC .......................................................... 361/56

(58) Field of Classification Search
USPC ............................................................ 361/56
See application file for complete search history.

(56) References Cited

U.S. PATENT DOCUMENTS

| | | | |
|---|---|---|---|
| 5,159,518 A * | 10/1992 | Roy | 361/56 |
| 5,629,544 A * | 5/1997 | Voldman et al. | 257/355 |
| 6,589,823 B1 * | 7/2003 | Beebe et al. | 438/151 |
| 7,532,446 B2 | 5/2009 | Cheng et al. | |
| 2004/0080883 A1 | 4/2004 | Chatterjee et al. | |
| 2004/0105203 A1 | 6/2004 | Ker et al. | |

(Continued)

FOREIGN PATENT DOCUMENTS

| FR | 2903833 A1 | 1/2008 |
|---|---|---|
| RU | 2287228 C2 | 11/2006 |

(Continued)

OTHER PUBLICATIONS

Ericsson, "Carrier aggregation in LTE-Advanced", 3GPP Draft, R1-082468, 3rd Generation Partnership Project (3GPP), Mobile Competence Centre, 650, Route Des Lucioles, F-06921 Sophia-Antipolis Cedex, France, vol. RAN WG1, No. Warsaw, Poland, Jun. 30, 2008, XP050110739.

(Continued)

*Primary Examiner* — Scott Bauer
(74) *Attorney, Agent, or Firm* — Sam Talpalatsky; Nicholas J. Pauley; Joseph Agusta (57) ABSTRACT

Diodes, including gated diodes and shallow trench isolation (STI) diodes, manufacturing methods, and related circuits are provided without at least one halo or pocket implant thereby reducing capacitance of the diode. In this manner, the diode may be used in circuits and other devices having performance sensitive to load capacitance while still obtaining the performance characteristics of the diode. Such characteristics for a gated diode include fast turn-on times and high conductance, making the gated diodes well-suited for electro-static discharge (ESD) protection circuits as one example. Diodes include a semiconductor substrate having a well region and insulating layer thereupon. A gate electrode is formed over the insulating layer. Anode and cathode regions are provided in the well region. A P-N junction is formed. At least one pocket implant is blocked in the diode to reduce capacitance.

27 Claims, 10 Drawing Sheets

(56) References Cited

U.S. PATENT DOCUMENTS

| | | | |
|---|---|---|---|
| 2004/0240127 | A1 | 12/2004 | Juliano et al. |
| 2005/0035409 | A1 | 2/2005 | Ko et al. |
| 2005/0035410 | A1 | 2/2005 | Yeo et al. |
| 2005/0057866 | A1 | 3/2005 | Mergens et al. |
| 2005/0266846 | A1 | 12/2005 | Kim et al. |
| 2006/0050581 | A1* | 3/2006 | Luk et al. ............... 365/205 |
| 2006/0128087 | A1 | 6/2006 | Bamji et al. |
| 2007/0029646 | A1 | 2/2007 | Voldman |
| 2007/0229154 | A1 | 10/2007 | Kim et al. |
| 2008/0056390 | A1 | 3/2008 | Rainbolt et al. |
| 2008/0237746 | A1* | 10/2008 | Lin et al. ............... 257/409 |
| 2008/0246086 | A1 | 10/2008 | Korec et al. |
| 2008/0285513 | A1 | 11/2008 | Jung et al. |
| 2009/0170269 | A1 | 7/2009 | Dutta |
| 2009/0180433 | A1 | 7/2009 | Ahn et al. |
| 2010/0032749 | A1* | 2/2010 | Shrivastava et al. ........ 257/328 |
| 2010/0034303 | A1 | 2/2010 | Damnjanovic et al. |
| 2010/0102390 | A1 | 4/2010 | Vashchenko et al. |
| 2010/0232077 | A1 | 9/2010 | Worley |

FOREIGN PATENT DOCUMENTS

| | | |
|---|---|---|
| WO | 03069806 A1 | 8/2003 |
| WO | 2006105005 A2 | 10/2006 |
| WO | 2006118418 A2 | 11/2006 |
| WO | WO2006125149 A2 | 11/2006 |
| WO | 2007052922 A1 | 5/2007 |
| WO | WO2008043078 A2 | 4/2008 |
| WO | WO2010105178 A2 | 9/2010 |
| WO | WO2010115137 A1 | 10/2010 |

OTHER PUBLICATIONS

Ericsson et al: "Text Proposal for DC-HSDPA assumptions and standards impact" 3GPP Draft; R1-082249 Text Proposal for DC-HSDPA Assumptions and Standards Impact, 3rd Generation Partnership Project (3GPP), Mobile Competence Centre; 650, Route Des Lucioles, F-06921 Sophia-Antipolis Cedex; France, vol. RAN WGI, No. Kansas City, USA; May 23, 2008, XP050110541, p. 8, paragraph 4.1-paragraph 4.2; p. 9, paragraph 4.3.1.

International Search Report and Written Opinion—PCT/US2012/031597—ISA/EPO—Jun. 27, 2012.

Qualcomm Europe: "Multicarrier Control for LTE-Advanced" 3GPP Draft; R1-090862, 3rd Generation Partnership Project (3GPP), Mobile Competence Centre; 650, Route Des Lucioles; F-06921 Sophia-Antipolis Cedex ; France, No. Athens, Greece; Feb. 3, 2009, XP050318712.

Thijs, S. et el, "Design methodology of FinFET devices that meet IC-Level HBM ESD targets," Symposium on Electrical Overstress/Electrostatic Discharge (EOS/ESD), Sep. 7-11, 2008, pp. 294-302, ISBN: 978-1-58537-146-4.

Worley et al., "CDM effect on a 65nm SOC LNA", 32nd Electrical Overstress/Electrostatic Discharge Symposium (EOS/ESD), Oct. 3, 2010, pp. 1-8, IEEE, XP031791670, ISBN: 978-1-58537-182-2.

Yang et al., "BSIM4-based lateral diode model for LNA co-designed with ESD protection circuit", 11th International Symposium on Quality Electronic Design (ISQED), Mar. 22, 2010, pp. 87-91, IEEE, XP031660196, ISBN: 978-1-4244-6454-8, DOI: 10.1109/ISQED.2010.5450396.

ZTE,"Technical scope for LTE-advanced evolution",3GPP TSG-RAN WG1#53b R1-082380,Jun. 30, 2008.

* cited by examiner

DIODE HAVING A POCKET IMPLANT BLOCKED AND CIRCUITS AND METHODS EMPLOYING SAME

CROSS REFERENCE TO RELATED APPLICATION

This application is a continuation-in-part of U.S. patent application Ser. No. 12/403,418 filed Mar. 13, 2009, in the name of WORLEY, et al., the disclosure of which is expressly incorporated herein by reference in its entirety.

TECHNICAL FIELD

The technology of the present application relates to shallow trench isolation diodes and gated diodes and their use in circuits and related methods, including protection circuits, electro-static discharge (ESD) protection circuits, and high speed or switching circuits

BACKGROUND

Figure 1:
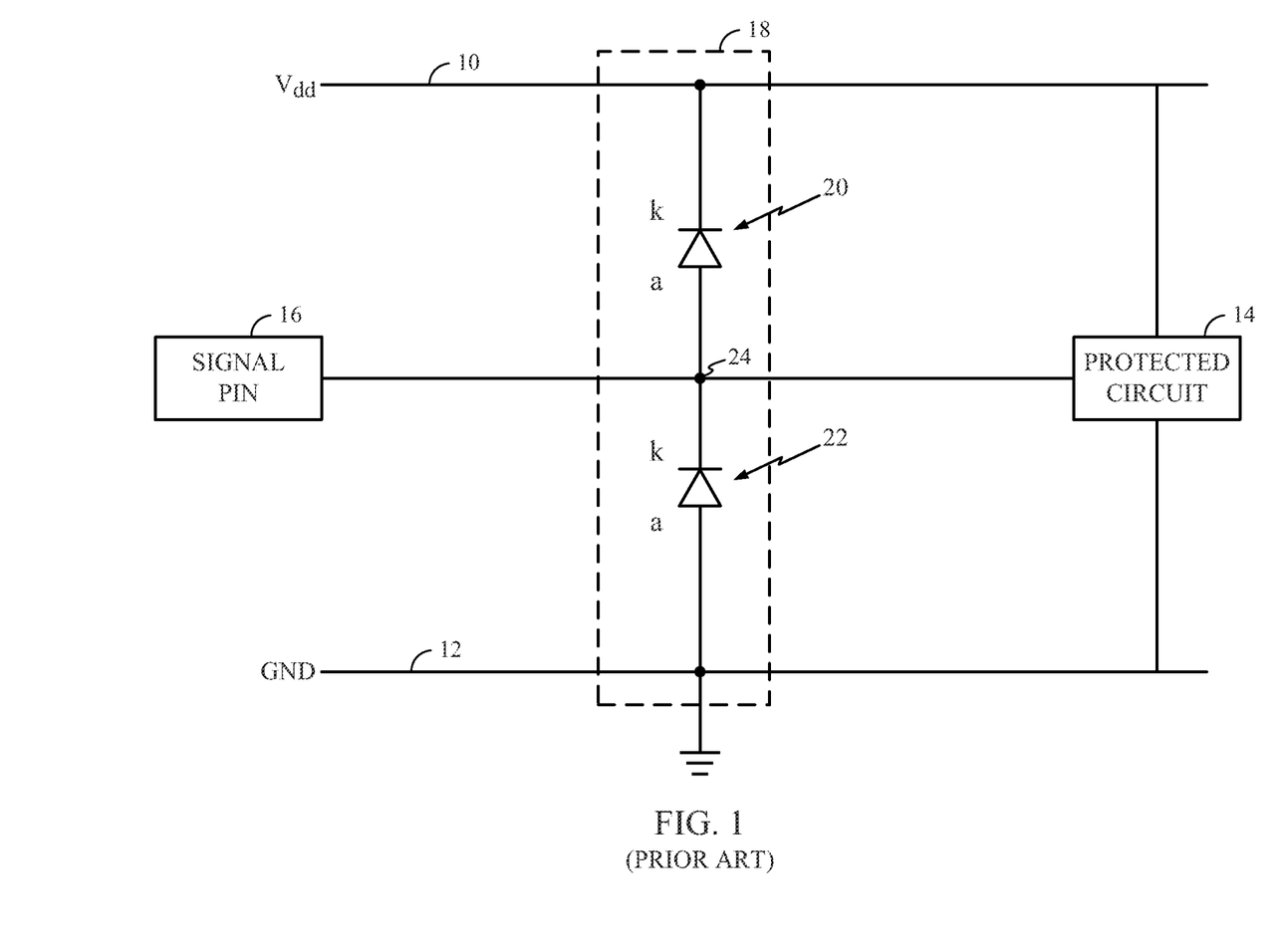
FIG. 1 is an example of a conventional electro-static discharge (ESD) protection circuit in the prior art.

Electro-static discharge (ESD) is a major reliability issue in integrated circuits (ICs). ESD is a transient surge in voltage (negative or positive) that may induce a large current in a circuit. To protect circuits against damage from ESD surges, protection schemes attempt to provide a discharge path for both positive and negative ESD surges. Conventional diodes can be employed in ESD protection circuits to clamp the voltage of positive and negative ESD surges to shunt current and prevent excessive voltage from being applied to a protected circuit. FIG. 1 illustrates a conventional ESD protection circuit in this regard. As illustrated in FIG. 1, a voltage rail ($V_{dd}$) 10 and a ground rail (GND) 12 are provided to power a protected circuit 14. The protected circuit 14 can be any type of circuit and provided in any form desired. In this example, a terminal in the form of a signal pin 16 provides a signal path to the protected circuit 14 for providing information and/or control to the protected circuit 14. For example, the protected circuit 14 may be included in an integrated circuit (IC), with the signal pin 16 being an externally available pin on the IC chip.

A conventional ESD protection circuit 18 may be coupled between the voltage rail 10 and ground rail 12 to protect the protected circuit 14 from ESD surges. The exemplary ESD protection circuit 18 in FIG. 1 includes two conventional diodes: a positive ESD surge diode 20 and a negative ESD surge diode 22. The positive ESD surge diode 20 and the negative ESD surge diode 22 are coupled in series. The positive ESD surge diode 20 clamps positive voltage on the signal pin 16 to one diode drop above the voltage rail 10. The negative ESD surge diode 22 clamps negative voltage on the signal pin 16 to one diode drop below the ground rail 12. A cathode (k) of the positive ESD surge diode 20 is coupled to the voltage rail 10. An anode (a) of the positive ESD diode 20 is coupled to the signal pin 16 at a node 24 on the signal path between the signal pin 16 and the protected circuit 14. A cathode (k) of the negative ESD surge diode 22 is also coupled to the node 24 on the signal path from the signal pin 16 to the protected circuit 1. An anode (a) of the negative ESD surge diode 22 is coupled to the ground rail 12.

For positive ESD surges on the signal pin 16, the positive ESD surge diode 20 will become forward biased and clamp voltage on the signal pin 16 to one diode drop above the voltage rail 10 to protect the protected circuit 14. Energy from such an ESD surge will be conducted through the positive ESD surge diode 20 in a forward biased mode and dispersed into the voltage rail 10. Appropriate ESD protection structures may be implemented (not shown) in the voltage rail 10 to eventually dissipate a positive ESD surge to the ground rail 12. For negative ESD surges on the signal pin 16, the surge is similarly dissipated. A negative ESD surge on the signal pin 16 will place the negative ESD surge diode 22 in a forward biased mode thus providing a low-impedance path relative to the protected circuit 14. Energy from the negative ESD surge will be dissipated into the ground rail 12.

Because circuits are increasingly being provided in system-on-a-chip (SOC) configurations due to higher transistor counts, providing ESD protection in SOC technologies is becoming increasingly important. SOC technologies may employ field effect transistors (FETs) that provide a relatively thin oxide gate dielectric. These relatively thin dielectrics are susceptible to destructive breakdown and damage by excessive voltages from an ESD surge event. Further, conventional diodes, such as the ESD surge diodes 20, 22 provided in FIG. 1, may not provide sufficient conduction for ESD protection in SOC technology.

To address these shortcomings in ESD protection, and for SOC technologies in particular, shallow trench isolation (STI) diodes have been provided in ESD protection circuits. Gated diodes are also being employed in ESD protection circuits. It has been shown that use of a gated diode has superior conductance per unit length as well as turn-on speed due to the transient path of its carriers. Turn-on speed of an ESD protection circuit is important for meeting charge device modeling (CDM) specifications where large amounts of current (e.g., several amps) can flow in a very small fraction of time (e.g., less than a nanosecond) during ESD events. However, even with these advantages of gated diodes, STI diodes are predominantly used in ESD protection circuits for high speed circuits. Gated diodes can unacceptably decrease performance. A gated diode has greater perimeter capacitance per unit diffusion or active length than an STI diode.

Increased perimeter capacitance in a gated diode increases the load capacitance when the gated diode is added to a protected circuit. Increasing load capacitance can negatively affect protected circuits. For example, increased load, capacitance can decrease switching times and frequency performance of a protected circuit, because charging time will be increased due to the ESD protection circuit being coupled to the protected circuit in an R-C circuit arrangement. Further, increased capacitance provided as a result of inserting an ESD protection circuit can decrease the sensitivity of radio frequency (RF) components, such as a low noise amplifier (LNA). However, use of an STI diode having a lower capacitance in an ESD protection circuit also has a trade off over a gated diode. Use of an STI diode in an ESD protection circuit can result in low CDM voltage tolerances for the protected circuit for both positive and negative surges, and especially for protected circuits and related processes employing thin oxide gate oxide dielectric devices coupled to a pad that can be found in large SOC chips.

To preserve performance, chip manufacturers and customers have had to accept the lower CDM voltage tolerances provided by use of STI diodes in ESD protection circuits, which results in greater ESD-related exposure and failures. Thus, a need exists to provide an ESD protection circuit that exhibits superior conductance and turn-on time as well as a low capacitance so as to not adversely affect performance of a protected circuit.

SUMMARY OF THE DISCLOSURE

A diode is offered. The diode includes a substrate and a first doped region doped with a first dopant. The first doped region is located in the substrate and does not have a pocket implant, thereby reducing area junction capacitance. The diode also includes a second doped region doped with a second dopant in the substrate, the second dopant having an opposite polarity of the first dopant. The diode further includes a first silicide portion formed on the first doped region. The diode also further includes a second silicide portion formed on the second doped region.

A method of manufacturing a diode is offered. The method includes forming shallow trench isolation regions defined by an active mask. The method also includes blocking a pocket implant with a pocket implant mask, so as to reduce area junction capacitance in the diode. The method further includes implanting a first doped region defined by a first implant mask after forming the shallow trench isolation regions. The method also further includes implanting a second doped region defined by a second implant mask after forming the shallow trench isolation regions. Still further, the method includes depositing a first silicide portion on the first doped region and depositing a second silicide portion on the second doped region.

An apparatus for manufacturing a diode is offered. The apparatus includes means for constructing a diode in a substrate and means for blocking a pocket implant with a pocket implant mask, so as to reduce area junction capacitance in the diode.

An electro static discharge (ESD) protection integrated circuit including a diode is offered. The diode includes a substrate and a first doped region doped with a first dopant. The first doped region is located in the substrate and does not have a pocket implant so as to reduce area junction capacitance. The diode also includes a second doped region doped with a second dopant in the substrate, the second dopant having an opposite polarity of the first dopant. The diode further includes a first silicide portion formed on the first doped region. The diode also further includes a second silicide portion formed on the second doped region. The ESD protection circuit also has an input contact coupled to the diodes, and a protected component coupled to the input contact via the diodes.

A method of manufacturing a diode is offered. The method includes the steps of forming shallow trench isolation regions defined by an active mask. The method also includes the step of blocking a pocket implant with a pocket implant mask, so as to reduce area junction capacitance in the diode. The method further includes the step of implanting a first doped region defined by n first implant mask after forming the shallow trench isolation regions. The method also includes the step of implanting a second doped region defined by a second implant mask after forming the shallow trench isolation regions. Still further, the method includes the step of depositing a first silicide portion on the first doped region and steps for depositing a second silicide portion on the second doped region.

DETAILED DESCRIPTION

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Aspects disclosed in the detailed description include examples of diodes, including gated diodes and shallow trench isolation (STI) diodes, exemplary methods of manufacture of the same, and related circuits and methods. The diode examples all have at least one halo or pocket implant blocked to reduce area capacitance. They may also feature at least one lightly-doped drain (LDD) implant blocked. In this manner, the diodes may be employed in circuits and other circuit applications having performance sensitive to such capacitance, but also seeking the performance characteristics of a gated or STI diode. Benefits of a gated diode include, but are not limited to, fast turn-on times and high conductance. Benefits of an STI diode include, but are not limited to, reduced capacitance and resulting increased sensitivity of RF components.

LDD implants and pocket implants (also called halo implants) are used in transistors and diodes to protect against the electric field spreading into undesired areas. In metal-oxide-semiconductor field-effect transistors (MOSFETs), LDD implants are included to increase operating voltage and long term reliability. Specifically, the LDD implants are used to reduce the electric field at the drain in order to reduce hot electron injection into the gate oxide. The halo or pocket implant is used to reduce the electro-static cross section of the drain so that electrostatic coupling between the drain and source is small. Otherwise, an electro-static drain to source coupling field will increase leakage current though drain induced barrier lowering (DIBL) when the MOSFET's gate to source potential is in the off state. Since MOSFETs can be bi-directional and because of process constraints, the LDD and halo implants are applied to both sides of the MOSFET gate. Thus, by providing N-type and P-type halo implants in a MOSFET, a much smaller electro-static cross section is present so that an electric field at either the source or drain terminal is spread out and is not as intense so as to provide the MOSFET with a low leakage current. Also, the field reduction at the drain through application of the LDD implant improves hot electron reliability.

In the context of MOSFETs, LDD implants address potential hot electron problems and pocket implants reduce drain induced barrier lowering (DIBL). In some MOSFETs the LDD implant and pocket implant are blocked, resulting in a MOSFET without an LDD implant or pocket implant. Such a MOSFET may result in a transistor with a reduction in dopant fluctuation in the transistor's channel, thereby reducing transistor mismatch. Such a MOSFET may also employ a longer channel length to compensate for the hot electron and DIBL problems that would have been addressed by the missing LDD and pocket implants.

Prior to the discoveries of this disclosure, blocking of a pocket implant was a technique limited to a MOSFET. There was no motivation to block a pocket implant in a diode. Diodes do not suffer from the problem of transistor mismatch, and there is no need to reduce dopant fluctuation for a diode. Diodes are used for different purposes, and no one in the art had any reason to block pocket implants in diodes In aspects disclosed herein, diodes include a semiconductor substrate having a well region. The well region includes a semiconducting material having an impurity. Impurities include either a P-doped or N-doped impurity. An insulating layer is provided on the well region. An electrode is formed over the insulating layer. An anode region and a cathode region are implanted in the well region on opposite sides of the gate electrode. Depending on the diode design, the anode region or cathode region has an impurity of opposite polarity from a well region to form a P-N junction. In one example, for a diode contained within an N-well region, the anode region has an impurity of opposite polarity impurity from the N-well region to form a P-N junction between the anode and well region. In another example, for a diode contained within a P-well region, the cathode region has an impurity of opposite polarity impurity from the P-well region to form a P-N junction between the cathode and well region. The well regions have at least one LDD implant and pocket implant blocked between either the anode region, the cathode region, or both the anode and cathode regions.

Figure 3:
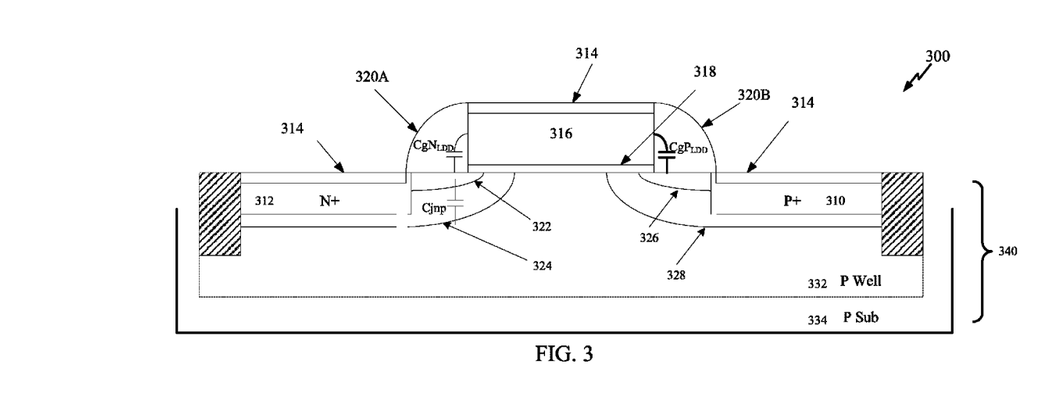
FIG. 3 is an exemplary gated diode including lightly-doped drain (LDD) implants and pocket implants.

FIG. 3 shows a conventional gated diode 300 with an LDD implant and a pocket implant. Since the P+ implant 310 is placed in P well 332 or P substrate 334 the pocket implant associated with PFETs is not provided for this case. An LDD implant 322 adds to the capacitance of the cathode 312 or N+ implant, $CgN_{LDD}$, by the extension under the gate. A P pocket implant 324 also adds to the cathode to Pwell capacitance by increasing the P doping along the LDD edge and the N+ edge. If the pocket implant 324 extends below the N+ implant as shown, the area junction capacitance (Cjnp) of the N+Pwell junction is also increased.

Further aspects of the conventional gated diode 300 are discussed below. The gated diode 300 demonstrates superior forward bias conductance (e.g., 30 mS/μm of stripe length) as well fast turn-on times, (e.g., on the order of one-hundred (100) picoseconds or less). As illustrated, the gated diode 300 includes a base semiconductor substrate 340 for depositing of other materials to form the gated diode 300. The semiconductor substrate 340 may be formed from a silicon (Si) wafer, because silicon wafers are relatively inexpensive. Alternatively, the semiconductor substrate 340 may be formed from any other semiconducting material desired. The semiconductor substrate 340 illustrated is an N-type gated diode having a P-well semiconducting material 332 forming a channel in a P-type substrate 334. However, the semiconductor substrate 340 could also be a P-type gated diode having an N-well semiconducting material formed in a P-type substrate having voltages and operations complimentary to an N-type gated diode. Other variants can include the diode structure of FIG. 3 surrounded by a deep N-well that is implanted into the P-type substrate 334.

Several semiconducting sub-regions are provided in the P-well semiconducting material 332 that are tailored to form the active device region of the gated diode 300. The sub-regions comprise an N+ doped region 312, an N-type LDD implant 322, a P+ doped region 310, and a P-type LDD implant 326 and an N type halo implant 328. The N+ doped region 312 forms an cathode region, and the P+ doped region 310 forms a anode region. These symbols indicate the type and amount of relative impurities introduced into the P-well semiconducting material 332. The gated diode 300 also includes a gate 316 that is isolated from the P-well semiconducting material 332 by an insulating layer 318. The insulating layer 318 is often referred to as an oxide layer, although other insulating materials are possible. The layer 318 may be of any thickness desired, but typically is very thin and may have a thickness between approximately 12 Angstroms (Å) and 80 Å as an example. The gate 316 may be formed from a conventional conducting material, but is provided in the form of polycrystalline silicon ("Polysilicon") in this example, as is well known. Silicide 314 is formed over the N+ implant 312, P+ implant 310, and over the gate 316.

During manufacturing LDD blocks are used to block LDD implantation on the side of one polarity implant while laying an LDD on the other side. For example, when manufacturing an N-type LDD implant (e.g., 322), an LDD block is used on the P side to prevent an N-type LDD implant from being placed on that side. Similarly, when manufacturing a P-type LDD implant (e.g., 326), an LDD block is used on the N side to prevent a P-type LDD implant from being placed on that side.

Spacer regions 320A, 320B are also provided on each side of the gate 316 as a result of a leftover residual insulating material placed over the gated diode 300 that were subsequently etched. The spacer regions 320A, 320B allow the N-type and P-type implants 312, 310 to be formed in the P-well semiconducting material 332 after spacer formation. The N-type and P-type LDD implants 322, 326 and pocket implant 324 are formed before spacer deposition.

Figure 4:
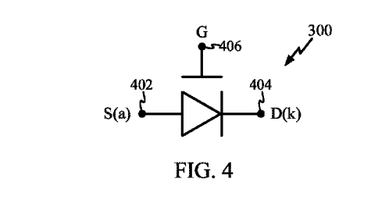
FIG. 4 is an exemplary schematic symbol to represent the gated diode of FIG. 3.

Thus in summary, the gated diode 300 is a three-terminal device as illustrated in FIG. 4. The three terminals are the cathode terminal 402, the anode terminal 404, and the gate terminal 406. A P-N junction exists between the P-well semi-conducting material 332 and the N+ doped region 312. Current can flow with relative ease from the anode terminal 402 coupled to the P+ doped region 310 to the cathode terminal 404 coupled to the N+ doped region 312 when a positive voltage difference is present between the anode terminal 402 and the cathode terminal 404. The gate terminal 406 is attached to the terminal whose diffusion region polarity is the same well region polarity. In the case of FIG. 3, the gate terminal 406 would be coupled to the anode terminal 402 since the anode terminal 402 is coupled to the P+ doped region 310 which is of the same polarity as the P-well semi-conducting material 332. The coupling arrangement reduces capacitive loading on the cathode terminal 404 which, for this polarity diode, can be coupled to the input/output (I/O) pad while the anode is coupled to a second voltage rail or ground. The gate has no electrical purpose in the operation of the diode as a protection element and is used as a fabrication vehicle to separate the N+ doped region 312 and P+ doped region 310 without an intervening STI region.

The gated diode 300 has several sources of parasitic capacitances that all add together to generate a total capacitance for the gated diode 300. As noted earlier, for the diode polarity of FIG. 3, the node coupled to the I/O is the cathode terminal 404 which should have as little capacitance as possible with respect to the power supply coupled to the anode terminal 402. For a common configuration, the gate terminal 406 is tied to the anode terminal 402. For the cathode terminal 404 which couples to a signal pad, a first parasitic capacitance is present due to the perimeter capacitance caused by the gate electrode 316 (hereinafter "gate capacitance") overlapping the N-type LDD implant 322. The insulating layer 318 between these materials acts as a dielectric to form the parallel plate capacitance. For example, a parasitic capacitance component is provided across the insulating layer 318 between the gate electrode 316 and the N-type LDD implant 322 overlapping the insulating layer 318 labeled $CgN_{LDD}$ in FIG. 3. A parasitic capacitance can also be similarly formed between the gate electrode 316 and the P-type LDD implant 326 overlapping the insulating layer 318 labeled $CgP_{LDD}$. Capacitance increases inversely proportional to the width of the insulating layer 318. The cathode of the gated diode 300 has a larger parasitic capacitance than an STI diode, because the STI diode has no gate electrode. Higher perimeter capacitance equates to a higher overall capacitance which can adversely impact the performance of a protected circuit when the gated diode 300 is employed in an ESD protection circuit.

Another parasitic capacitance is formed between the sidewall of the N-type LDD implant 322 between the halo implant semiconducting material 324 labeled Cjnp. A higher concentration in doping of the halo semiconducting material 324 between the insulating layer 318 and the N-type LDD implant 322 also contributes to an increase in this parasitic capacitance. These factors all contribute to an overall increase in parasitic capacitance of the cathode of the gated diode 300.

Figure 5A:
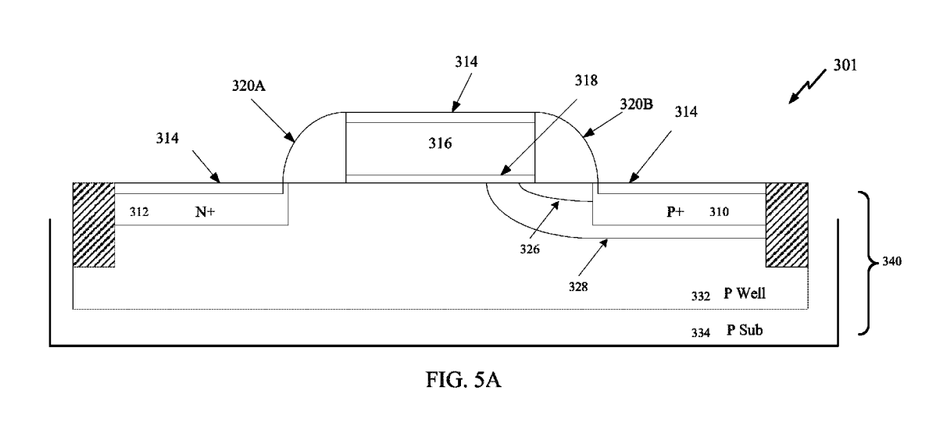
FIG. 5A is an exemplary gated diode blocking a pocket implant to reduce junction capacitance of the N+ P-well gated diode.
Figure 5B:
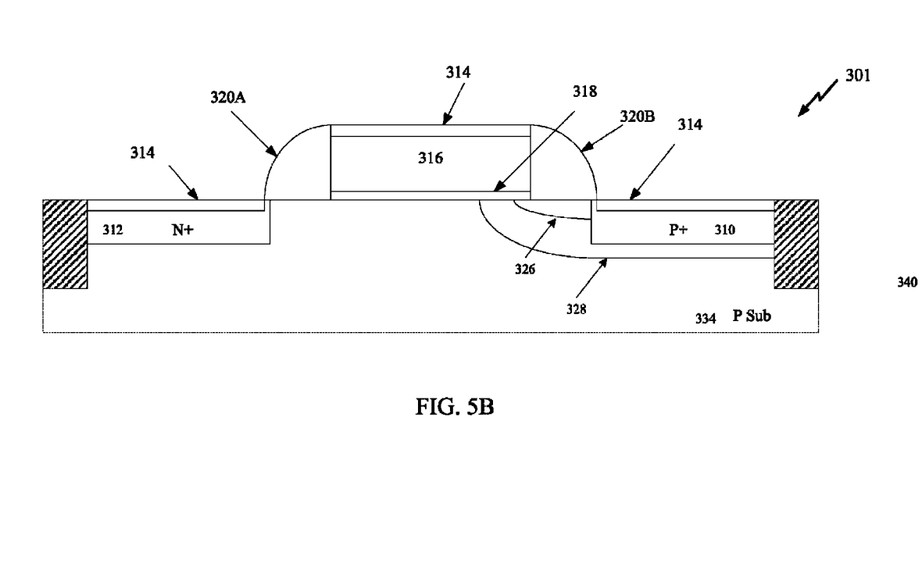
FIG. 5B is an exemplary gated diode blocking a pocket implant and P Well.

As was discovered following the filing of U.S. patent application Ser. No. 12/403,418, in certain manufacturing cases blocking the LDD implant also blocks the pocket implant as the LDD implant and pocket implant are installed as part of the same masking step. Thus, in blocking the pocket implant an LDD implant on the blocked side may be blocked at the same time. Blocking means that the pocket implant is left out of the formation of the diode, for example the gated diode 300. This is illustrated by example in FIG. 5A. Therein, an exemplary gated diode 301 is shown. Thus, the gated diode 301 has the same characteristics of the gated diode 300 of FIG. 3, except that the N-type LDD implant 322 and the P-type pocket implant 324 are blocked in the gated diode 301 in FIG. 5A. The gated diode 301 is provided in a semiconductor package including a semiconductor die and which can be mounted on a printed circuit board (PCB). An N Well (not shown in the figures) may also be included. In one aspect, the P Well 332 of the gated diode may also be blocked, as shown in FIG. 5B. In this aspect, the diode is formed directly in the substrate P Sub 334. Removing the P Well implant in this fashion may reduce the doping in the diode as the P substrate is more lightly doped than a P well.

It was discovered in certain modeling that junction capacitance may be significantly reduced for diodes by blocking pocket implants. In aspects disclosed herein, the junction capacitance of a diode (for example a gated diode or STI diode) is reduced by blocking a pocket implant from the diode. Removing the pocket implant does not effect conductivity modulation or ESD performance, making such reduced capacitance diodes desirable for use in ESD protection circuitry. The removal of the LDD and halo of the P+ diffusion is optional. There is no effect on capacitance or ESD conduction as to whether or not the LDD or halo implants are present on the P+ diffusion or implant.

Removing a pocket implant provides unexpected performance benefits for diodes. For example, for an STI diode, removing the pocket implant may reduce area capacitance by approximately 30% and total capacitance by approximately 25%. Removal of the pocket implant does not have negative effects on the STI diode in the high injection range of ESD currents. Using a performance metric of on-resistance of a diode in ESD mode times its load capacitance, a gated diode with pocket implants blocked performs close to two times better than a standard STI diode. STI diodes with pocket implants blocked also perform better than standard STI diodes.

Due to the blocked pocket implant, in the gated diode 301, the LDD-gate overlap capacitance approaches 0 and the LDD-pocket capacitance is removed. Further, the junction capacitance component of the pocket implant that runs under the N+ implant is also effectively removed. Thus, the cathode to gate capacitance, the cathode sidewall junction capacitance, and the cathode area junction capacitance are all significantly reduced. Transmission Line Pulse (TLP) data from both the standard gated diode 300 and the improved diode 301 show that the omitted LDD and pocket implants have no noticeable effect on high pulse current performance.

Figure 6:
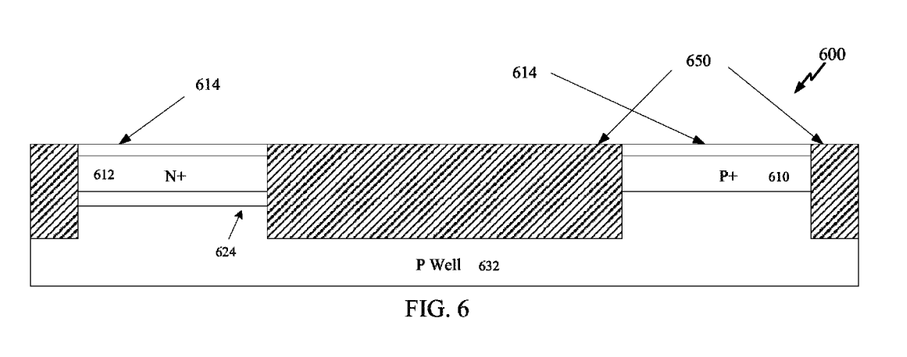
FIG. 6 is an exemplary shallow trench isolation diode including a pocket implant.

As discussed, removing the P pocket implant can also reduce the area junction capacitance of an STI diode. FIG. 6 shows a cross section of an STI diode 600 in which the pocket implant 624 extends below the N+ implant 612. Silicide 614 is formed over the N+ implant 612 and P+ implant 610. The presence of the P pocket implant 624 below the N+ implant 612 increases the doping of the P region 610 of the diode thereby increasing the area junction capacitance. The side wall component of capacitance is quite small compared to the area component due the thick dielectric isolation region 650 associated with STI diodes.

Figure 7A:
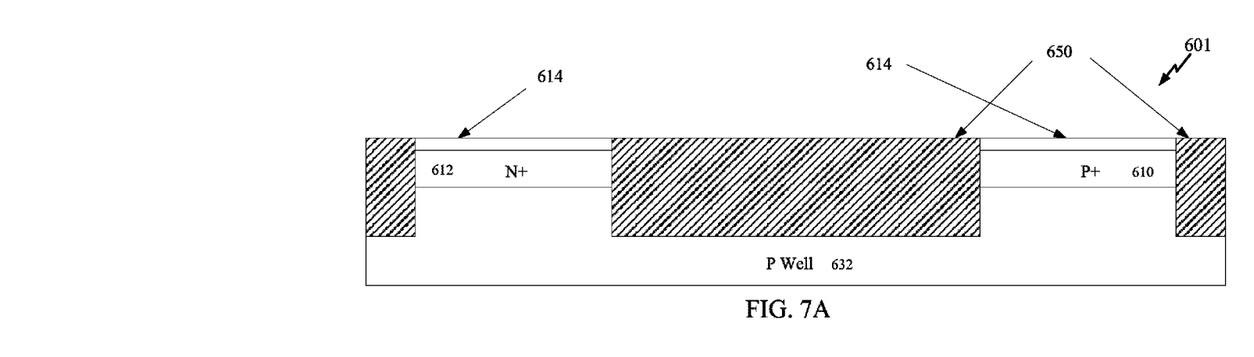
FIG. 7A is an exemplary shallow trench isolation (STI) diode blocking a pocket implant to reduce junction capacitance.
Figure 7B:
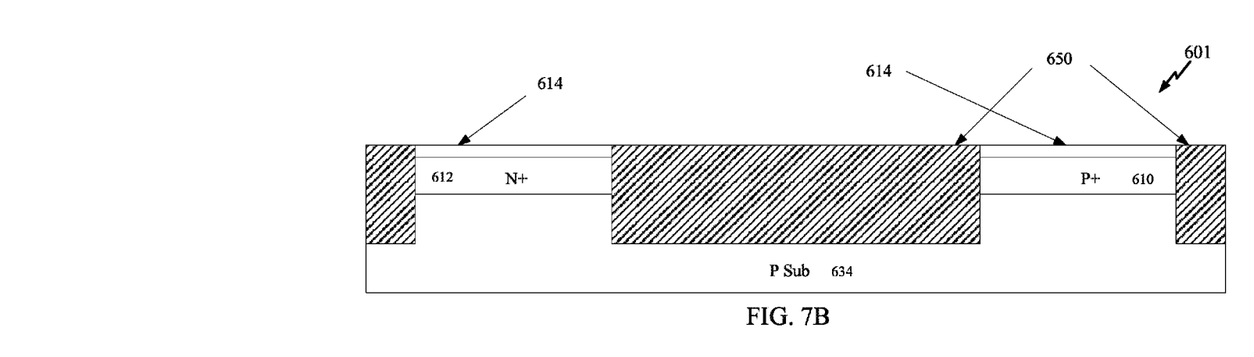
FIG. 7B is an exemplary shallow trench isolation (STI) diode blocking a pocket implant and P Well.

FIG. 7A shows one aspect of an STI diode with reduced area capacitance due to a blocked pocket implant. An N Well (not shown in the figures) may also be included. In another aspect, the P Well 632 of the STI diode may also be blocked, as shown in FIG. 7B. In this aspect, the diode is formed directly in the substrate P Sub 634. Removing the P Well implant in this fashion may reduce the doping in the diode as the P substrate is more lightly doped than the P well. STI diodes differ from gated diodes in that LDD implants are not used with STI diodes, thus a distinct block is used to block the pocket implant in an STI diode, whereas with a gated diode the same layer may be used to block the LDD implant and pocket implant. Even so, the layer used to block LDD implants in other diodes may also be used to block the pocket implant from forming during manufacturing of the STI diode.

Blocking the pocket implant from the diode reduces junction capacitance. For a gated diode with a blocked pocket implant, both sidewall and area junction capacitances are reduced due to the blocked pocket implant and LDD implant. For an STI diode where the sidewall is an insulator, blocking the pocket implant reduces the area capacitance. Removal of the pocket implant has no impact on ESD performance.

A diode having a blocked pocket implant, such as the gated diode 301 or STI diode 601 discussed above, may be included in any circuit, integrated circuit, or circuit application. One example includes an electro-static discharge (ESD) protection circuit. The ESD protection circuit may be configured like the ESD protection circuit 18 illustrated in FIG. 1, where one or more of the conventional ESD surge diodes 20, 22 are replaced by one or more gated diodes having a blocked LDD implant and blocked pocket implant. Employing one or more gated diodes having at least one LDD implant blocked in an ESD protection circuit enhances voltage clamping times due to the fast turn-on time of a gated diode as well as shunting excessive current as a result of the gated diode's high conductance properties. Also, the use of one or more gated diodes having at least one LDD implant blocked reduces the load capacitance of an ESD protection circuit. This may allow an ESD protection circuit to be employed to protect circuits whose performance is sensitive to load capacitance while still achieving the ESD characteristics of gated diodes. Reducing load capacitance may be important in the protected circuit operating properly, including at desired performance, speed, and/or sensitivity.

Figure 8:
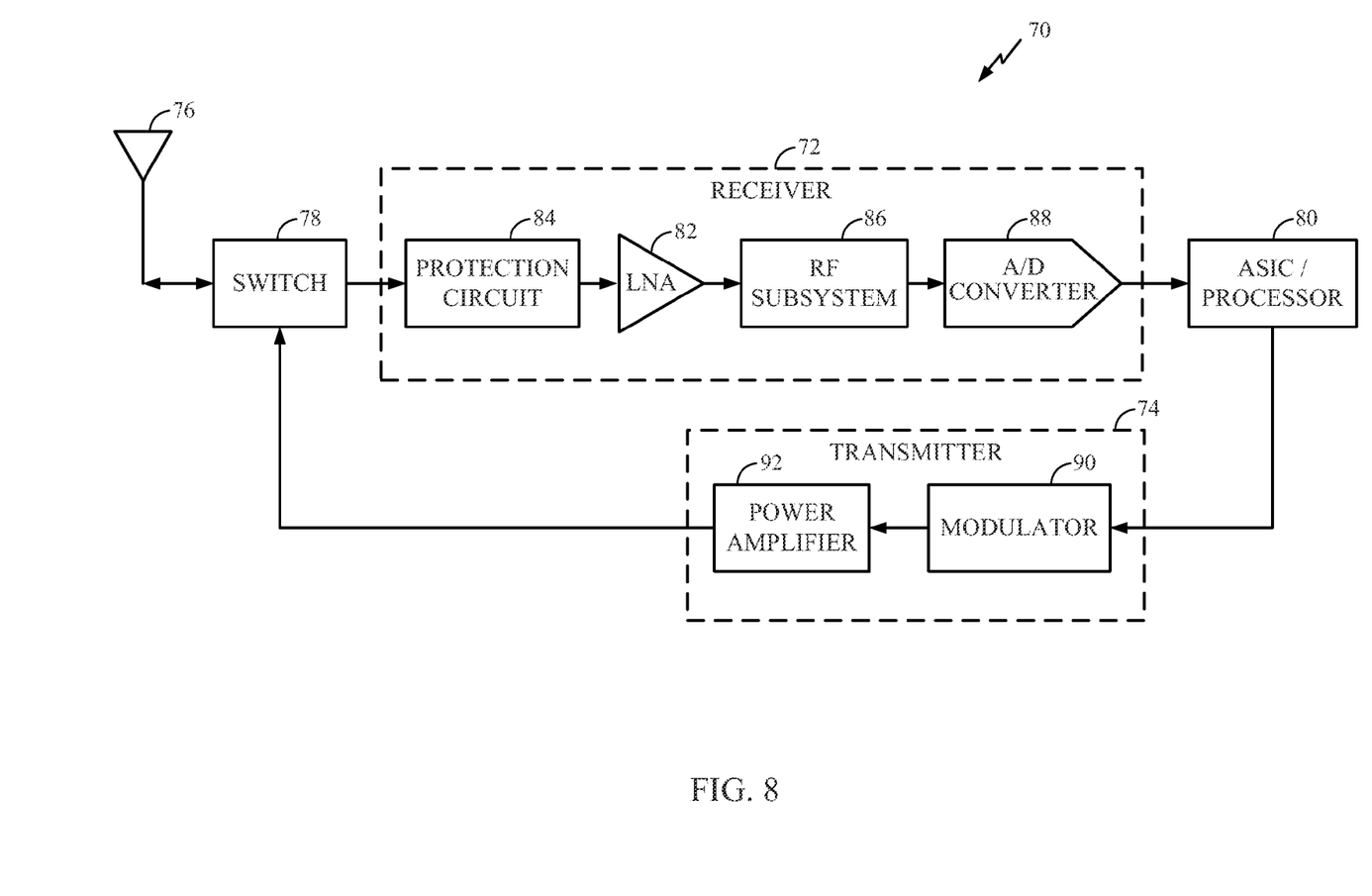
FIG. 8 is an exemplary radio frequency (RF) transceiver that includes a protection circuit having at least one gated diode blocking at least one LDD implant.

A gated diode having at least one LDD implant blocked may be used in any device or circuit, and may be used particularly for circuits in which performance may be sensitive to load capacitance. Examples of such devices and circuits include high speed differential input/output circuits and radio frequency (RF) circuits, including but not limited to low noise amplifiers (LNAs). FIG. 8 illustrates a transceiver 70 as one possible device and/or integrated circuit for providing a protection circuit employing one or more diodes having a pocket implant blocked to protect a low noise amplifier (LNA). The diode or diodes employed in the protection circuit may be one or more of the gated diode 301 or STI diode 601 previously described. The transceiver 70 may be implemented in semiconductor-on-insulator (SOI) and/or SOC technology. The transceiver 70 may be employed in any device, including, as examples, a mobile telephone or terminal, personal digital assistant (PDA), wireless Local ea Network (LAN), or other similar wireless communication device(s).

As illustrated in FIG. 8, the transceiver 70 may include a receiver front end 72, a radio frequency (RF) transmitter 74, an antenna 76, a switch 78, and a processor 80. The receiver front end 72 receives information bearing radio frequency signals from one or more remote transmitters (not shown). A low noise amplifier (LNA) 82 amplifies an incoming signal received by the antenna 76. A protection circuit 84 is added to the receiver front end 72 to protect the LNA 82 and downstream circuitry from surges, including ESD surges. However, adding load capacitance to the LNA 82 could decrease its sensitivity. In this regard, the protection circuit 84 can incorporate at least one gated diode having at least one LDD implant blocked. In this manner, the added load capacitance from the protection circuit 84 is reduced while still providing the superior turn-on time and high conductance handling capability through use of a gated diode in the protection circuit 84. The diode or diodes employed in the ESD protection circuit 84 may be one or more of the gated diodes 301 or STI diodes 601 previously described. Further, the protection circuit 84 may be an ESD protection circuit and may be configured like the ESD protection arrangement and ESD protection circuit 18 illustrated in FIG. 1, or any other arrangement or circuit desired. For example, a gated diode may be provided to clamp an excessive positive voltage, an excessive negative voltage, or both, to shunt excessive current generated as a result.

The amplified signal leaving the LNA 82 may be provided to an RF subsystem 86 where it then may be digitized using an analog-to-digital (A/D) converter 88. From there, the digitized signal may be provided to an application specific integrated circuit (ASIC) or other processor 80 to be processed according to the application. For example, the ASIC or processor 80 can process the digitized, received signal to extract the information or data bits conveyed in the received signal. This processing may include demodulation, decoding, and error correction operations. The ASIC or processor 80 may be implemented in one or more digital signal processors (DSPs).

On the transmit side, the ASIC or processor 80 can receive digitized data generated as a result of the received signal, which it encodes for transmission. After encoding the data, the ASIC or processor 80 outputs the encoded data to the RF transmitter 74. A modulator 90 receives the data from the ASIC or processor 80 and in this embodiment, operates according to one or more modulation schemes to provide a modulated signal to power amplifier circuitry 92. The power amplifier circuitry 92 amplifies the modulated signal from the modulator 90 to a level appropriate for transmission from the antenna 76.

Figure 9:
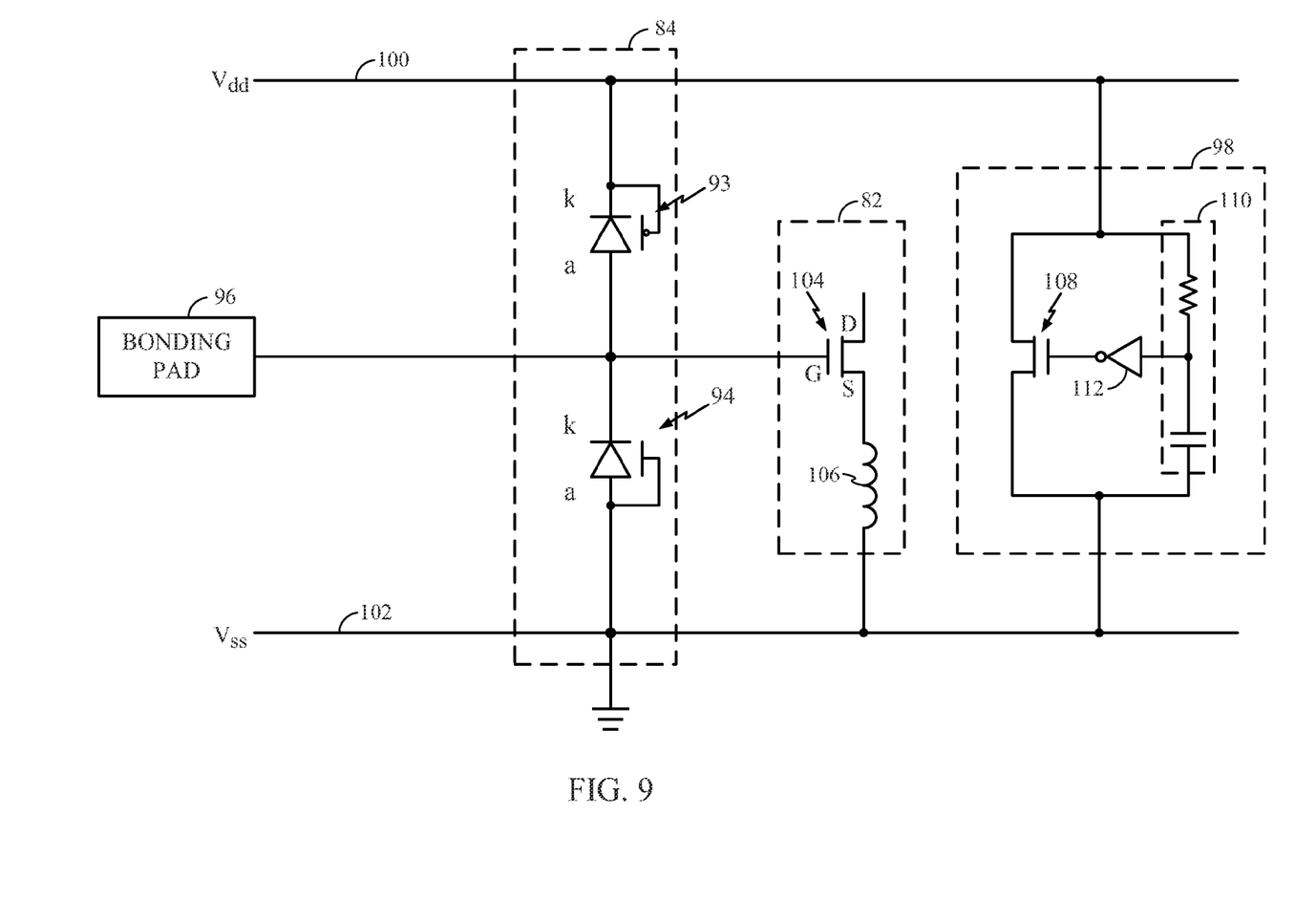
FIG. 9 is an exemplary low noise amplifier protected by an ESD protection circuit employing gated diodes having at least one LDD implant blocked.

FIG. 9 illustrates an exemplary ESD protection circuit employing gated diodes that may be employed as the protection circuit 84 in the transceiver 70 of FIG. 8. FIG. 9 illustrates the protection circuit 84 configured to protect an input of the LNA 82. As illustrated, the protection circuit 84 includes two gated (or STI) diodes 93, 94 coupled to a bonding pad 96 and a transient clamp 98 coupled to $V_{dd}$ 100 and $V_{ss}$ 102. The gated diodes 93, 94 each have a pocket implant blocked and may be provided according to the example gated diode 301 discussed above. The protected LNA 82 includes a thin oxide amplifying N-channel field effect transistor (NFET) 104 and a source degeneration inductor 106 between the source (S) of the NFET 104 and $V_{ss}$ 102. If a positive current is injected into the bonding pad 96 with respect to $V_{ss}$ 102 during a CDM event, current will flow from the bonding pad 96 through gated diode 93 to $V_{dd}$ 100 and then from $V_{dd}$ 100 to $V_{ss}$ 102 through the transient clamp 98. The transient clamp 98 comprises an NFET 108 coupled from $V_{dd}$ 100 $V_{ss}$ 102, a resistor capacitor (RC) transient detector or RC circuit 110, and an inverter 112 acting as a buffer between the RC transient detector 110 and the NFET 108. During a high-speed transient voltage appearing from $V_{dd}$ 100 to $V_{ss}$ 102, the RC transient detector 110 turns on the NFET 108 thereby allowing the NFET 108 to shunt a large current with a small voltage drop. During normal operation, the NFET 108 is biased off by the RC transient detector 110.

As an example, the voltage drop between the bonding pad 96 and $V_{ss}$ 102 should be low enough to keep the gate (G) to source (S) voltage across the NFET 104 below the gate oxide rupture voltage for a pulse width of 1 nanosecond (ns), which approximately corresponds to a CDM pulse width. For a 20 Å thick oxide, the gate (G) to source (S) rupture voltage of the NFET 104 is approximately 6.9V for a 1 ns pulse. The source degeneration inductor 106 has a small effect on the gate (G) to source (S) voltage drop across the NFET 104. Thus, for a positive pad to $V_{ss}$ 102 current, the gated diode 93 and the NFET 108 have a cumulative voltage drop of less than 6.9 V for CDM current amplitudes of several amps.

Figure 10:
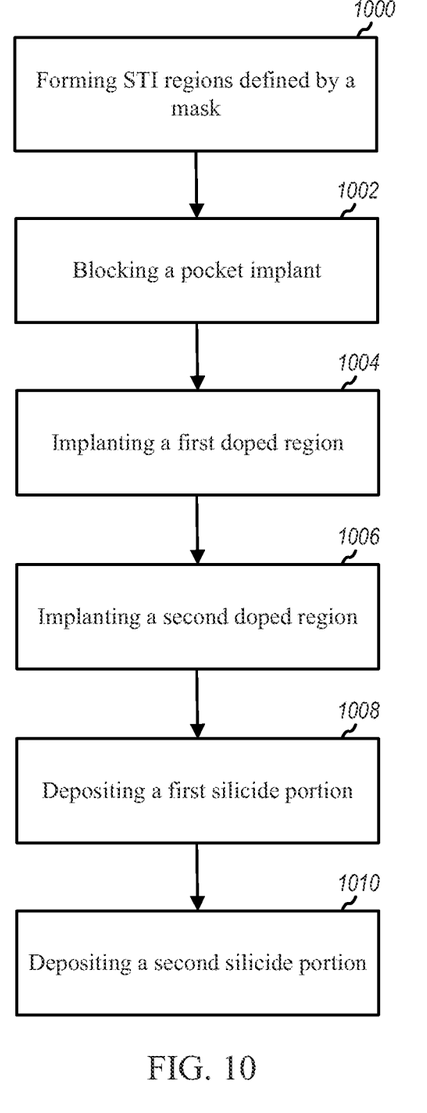
FIG. 10 describes an exemplary method for manufacturing diodes according to one aspect of the present disclosure.

FIG. 10 illustrates a method of manufacturing diodes according to one aspect of the present disclosure. As shown in block 1000, shallow trench isolation (STI) regions defined by an active mask are formed. As shown in block 1002, a pocket implant is blocked with a pocket implant mask, so as to reduce area junction capacitance in the diode. After forming the STI regions, a first doped region defined by a first implant mask is implanted as shown in block 1004. After forming the STI regions, a second doped region defined by a second implant mask is implanted as shown in block 1006. As shown in block 1008, a first silicide portion is deposited on the first doped region. As shown in block 1010, a second silicide portion is deposited on the second doped region.

An apparatus may have means for constructing a diode in a substrate and means for blocking a pocket implant with a pocket implant mask, so as to reduce area junction capacitance in the diode. The apparatus may also have means for forming a well implant in the substrate. The apparatus may also have means for forming a gate for the diode, in which the diode is a gated diode.

Various modifications may be made to the above diode structures. In particular, the teachings above may be applied to P+ diodes in Nwell by changing the implant polarities from N to P and from P to N for all of the figures and descriptions above. Further, depending on the composition of the various layers and etches used, the order in which certain layers are placed or deposited can be varied. It will also be recognized that the order of layers and the materials forming those layers in a gated or STI diode in the above embodiments are merely exemplary. Moreover, in some embodiments, other layers (not shown) may be placed or deposited and processed to form portions of a diode device or to form other structures on the substrate. In other embodiments, these layers may be formed using alternative deposition, patterning, and etching materials and processes, may be placed or deposited in a different order, or composed of different materials, as would be known to one of skill in the art.

A diode or integrated circuit according to embodiments disclosed herein may be included or integrated in a semiconductor die and/or in any other device, including an electronic device. Examples of such devices include, without limitation, a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player.

Figure 2:
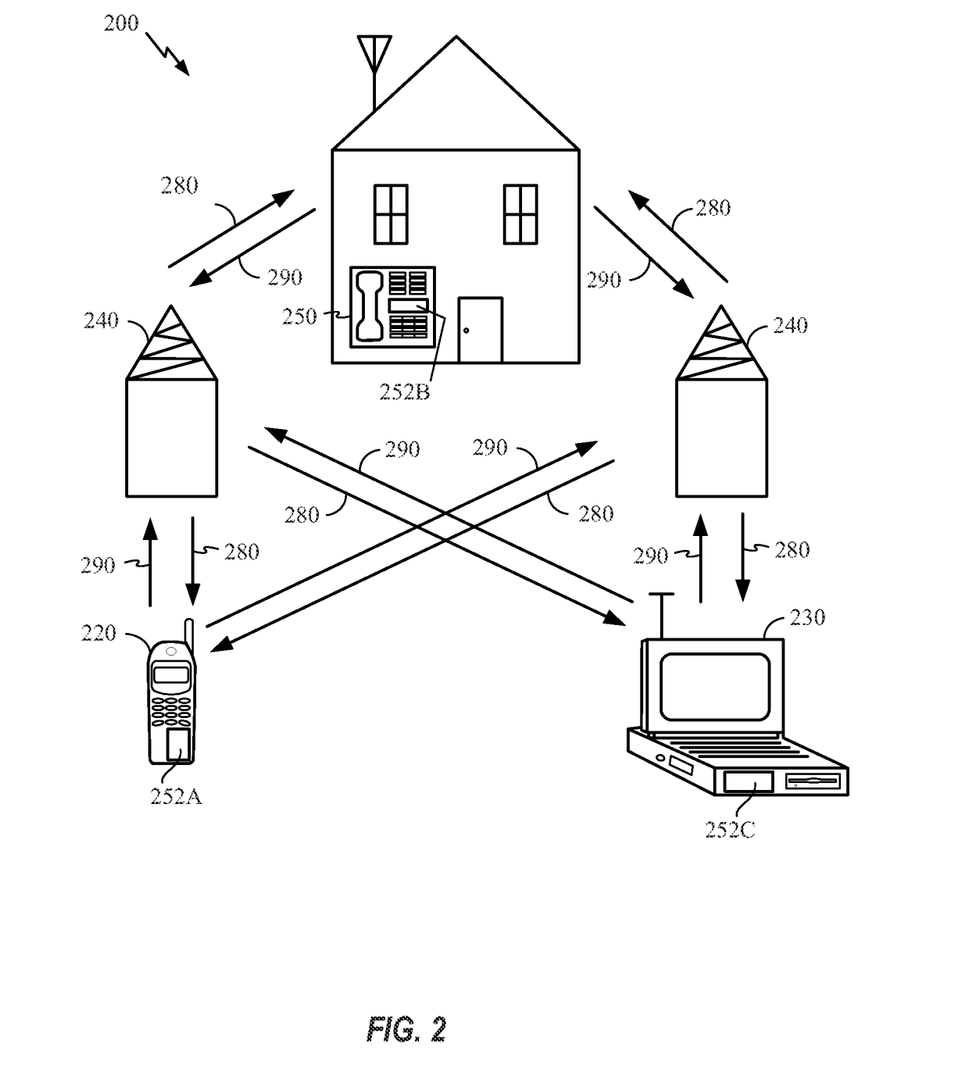
FIG. 2 is a block diagram showing an exemplary wireless communication system in which an embodiment of the disclosure may be advantageously employed.

FIG. 2 is a block diagram showing an exemplary wireless communication system 200 in which an embodiment of the disclosure may be advantageously employed. For purposes of illustration, FIG. 2 shows three remote units 220, 230, and 250 and two base stations 240. It will be recognized that wireless communication systems may have many more remote units and base stations. Remote units 220, 230, and 250 include IC devices 225A, 225C and 225B, that include the disclosed diode. It will be recognized that other devices may also include the disclosed diode, such as the base stations, switching devices, and network equipment. FIG. 2 shows forward link signals 280 from the base station 240 to the remote units 220, 230, and 250 and reverse link signals 290 from the remote units 220, 230, and 250 to base stations 240.

In FIG. 2, remote unit 220 is shown as a mobile telephone, remote unit 230 is shown as a portable computer, and remote unit 250 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 2 illustrates remote units according to the teachings of the disclosure, the disclosure is not limited to these exemplary illustrated units. Embodiments of the disclosure may be suitably employed in any device which includes diode.

It is also noted that the operational tasks described in any of the exemplary embodiments herein are described to provide examples and discussion. The operations described may be performed in numerous different sequences other than the illustrated sequences. Furthermore, operations described in a single operational task may actually be performed in a number of different tasks. Additionally, one or more operational tasks discussed in the exemplary embodiments may be combined. Those of ordinary skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A diode, comprising:
   a substrate;
   a first doped region doped with a first dopant, the first doped region located in the substrate, the first doped region not having a pocket implant so as to reduce area junction capacitance; and
   a second doped region doped with a second dopant in the substrate, the second dopant having an opposite polarity of the first dopant, the first doped region separated from the second doped region by a portion of the substrate.

2. The diode of claim 1 further comprising a gate, in which the diode is a gated diode.

3. The diode of claim 1 further comprising shallow trench isolation layers adjacent the first and second doped regions, in which the diode is a shallow trench isolation (STI) diode.

4. The diode of claim 1 further comprising a well implant defined by an implant block, the well implant being located in the substrate, the first and second doped regions being located in the well implant.

5. The diode of claim 1 integrated into at least one of a mobile phone, a set top box, a music player, a video player, an entertainment unit, a navigation device, a computer, a hand-held personal communication systems (PCS) unit, a portable data unit, and a fixed location data unit.

6. A method of manufacturing a diode, the method comprising:
   forming shallow trench isolation regions defined by an active mask;
   blocking a pocket implant with a pocket implant mask, so as to reduce area junction capacitance in the diode;
   implanting a first doped region defined by a first implant mask after forming the shallow trench isolation regions; and
   implanting a second doped region defined by a second implant mask after forming the shallow trench isolation regions, the first doped region separated from the second doped region by a portion of the substrate.

7. The method of claim 6 in which the diode is a gated diode.

8. The method of claim 6 in which the diode is a shallow trench isolation diode.

9. The method of claim 6 further comprising blocking a lightly-doped drain (LDD) implant with the pocket implant mask.

10. The method of claim 6 further comprising, prior to forming shallow trench isolation regions, forming a well implant.

11. The method of claim 6 further comprising integrating the diode into at least one of a mobile phone, a set top box, a music player, a video player, an entertainment unit, a navigation device, a computer, a hand-held personal communication systems (PCS) unit, a portable data unit, and a fixed location data unit.

12. An apparatus for manufacturing a diode, the apparatus comprising:
    means for forming doped regions within a substrate, the doped regions separated from each other by a portion of the substrate; and
    means for blocking a pocket implant so as to reduce area junction capacitance in the diode.

13. The apparatus of claim 12 further comprising means for forming a well implant in the substrate.

14. The apparatus of claim 12 further comprising means for forming a gate for the diode, in which the diode is a gated diode.

15. The apparatus of claim 12 in which the diode is a shallow trench isolation (STI) diode.

16. The apparatus of claim 12 in which the diode is integrated into at least one of a mobile phone, a set top box, a music player, a video player, an entertainment unit, a navigation device, a computer, a hand-held personal communication systems (PCS) unit, a portable data unit, and a fixed location data unit.

17. An electrostatic discharge (ESD) protection integrated circuit, comprising:
    a plurality of diodes, each diode comprising:
        a substrate;
        a first doped region doped with a first dopant, the first doped region located in the substrate, the first doped region not having a pocket implant so as to reduce area junction capacitance;
        a second doped region doped with a second dopant in the substrate, the second dopant having an opposite polarity of the first dopant, the first doped region separated from the second doped region by a portion of the substrate;
    an input contact coupled to the diodes; and
    a protected component coupled to the input contact via the diodes.

18. The ESD protection integrated circuit of claim 17 in which the diode is a gated diode and further comprises a gate.

19. The ESD protection integrated circuit of claim 17 in which the diode further comprises shallow trench isolation layers adjacent the first and second doped regions, in which the diode is a shallow trench isolation (STI) diode.

20. The ESD protection integrated circuit of claim 17 in which the diode further comprises a well implant defined by an implant block, the well implant being located in the substrate, the first and second doped regions being located in the well implant.

21. The ESD protection integrated circuit of claim 17 integrated into at least one of a mobile phone, a set top box, a music player, a video player, an entertainment unit, a navigation device, a computer, a hand-held personal communication systems (PCS) unit, a portable data unit, and a fixed location data unit.

22. A method of manufacturing a diode, the method comprising the steps of:
    forming shallow trench isolation regions in a substrate, the shallow trench isolation regions defined by an active mask;
    blocking a pocket implant with a pocket implant mask, so as to reduce area junction capacitance in the diode;
    implanting a first doped region defined by a first implant mask after forming the shallow trench isolation regions; and
    implanting a second doped region defined by a second implant mask after forming the shallow trench isolation regions, the first doped region separated from the second doped region by a portion of the substrate.

23. The method of claim 22 further comprising integrating the diode into at least one of a mobile phone, a set top box, a music player, a video player, an entertainment unit, a navigation device, a computer, a hand-held personal communication systems (PCS) unit, a portable data unit, and a fixed location data unit.

24. The diode of claim 1, further comprising:
    a first silicide portion formed on the first doped region; and
    a second silicide portion formed on the second doped region.

25. The method of claim 6, further comprising:
    depositing a first silicide portion on the first doped region; and
    depositing a second silicide portion on the second doped region.

26. The ESD protection integrated circuit of claim 17 in which the diode further comprises:
    a first silicide portion formed on the first doped region; and
    a second silicide portion formed on the second doped region;
    an input contact coupled to the diodes.

27. The method of claim 22, further comprising:
    depositing a first silicide portion on the first doped region; and
    depositing a second silicide portion on the second doped region.

* * * * *